(12) United States Patent
Sun

(10) Patent No.: US 9,236,364 B2
(45) Date of Patent: *Jan. 12, 2016

(54) PACKAGE CARRIER AND MANUFACTURING METHOD THEREOF

(71) Applicant: Subtron Technology Co., Ltd., Hsinchu County (TW)

(72) Inventor: Shih-Hao Sun, Hsinchu County (TW)

(73) Assignee: Subtron Technology Co., Ltd., Hsinchu County (TW)

(*) Notice: Subject to any disclaimer, the term of this patent is extended or adjusted under 35 U.S.C. 154(b) by 77 days.

This patent is subject to a terminal disclaimer.

(21) Appl. No.: 14/086,987

(22) Filed: Nov. 22, 2013

(65) Prior Publication Data

US 2015/0090481 A1  Apr. 2, 2015

(30) Foreign Application Priority Data

Sep. 27, 2013 (TW) .............................. 102135030 A

(51) Int. Cl.
*H05K 1/09* (2006.01)
*H01L 23/00* (2006.01)
(Continued)

(52) U.S. Cl.
CPC ............. *H01L 24/85* (2013.01); *H01L 21/4825* (2013.01); *H01L 21/4832* (2013.01); *H01L 21/6835* (2013.01); *H01L 23/49582* (2013.01); *H01L 24/81* (2013.01); *H01L 24/83* (2013.01);
(Continued)

(58) Field of Classification Search
CPC ............. H05K 1/02; H05K 3/00; H05K 3/02; H05K 3/10; H05K 3/20; H01L 21/30; H01L 21/46; H01L 23/00

USPC ............. 174/257, 250; 361/795; 29/831, 846, 29/847; 156/247, 248; 438/455, 458
See application file for complete search history.

(56) References Cited

U.S. PATENT DOCUMENTS

2004/0120129 A1* 6/2004 Soto et al. ...................... 361/795
2006/0200983 A1* 9/2006 Shimamura et al. ............ 29/847
(Continued)

FOREIGN PATENT DOCUMENTS

JP  2004095749   3/2004
JP  2006216977   8/2006
(Continued)

OTHER PUBLICATIONS

"Office Action of Taiwan Counterpart Application", issued on Aug. 18, 2014, p. 1-p. 5.
(Continued)

*Primary Examiner* — Xiaoliang Chen
(74) *Attorney, Agent, or Firm* — Jianq Chyun IP Office

(57) ABSTRACT

A manufacturing method of a package carrier includes the following steps. Firstly, two base metal layers are bonded together. Then, two supporting layers are laminated onto the base metal layers respectively. Next, two release metal films are disposed on the supporting layers respectively, wherein each of the release metal films includes a first metal film and a second metal film separable from each other. Next, two patterned metal layers are formed on the release metal films respectively, wherein each of the patterned metal layers is suitable for carrying and electrically connected to a chip. Then, the base metal layers are separated from each other to form two package carriers independent from each other. A package carrier formed by the manufacturing method described above is also provided.

9 Claims, 5 Drawing Sheets

(51) Int. Cl.
*H05K 1/11* (2006.01)
*H01L 21/48* (2006.01)
*H01L 21/683* (2006.01)
H01L 23/31 (2006.01)
H01L 23/495 (2006.01)
H01L 21/56 (2006.01)

(52) U.S. Cl.
CPC ............... *H05K 1/09* (2013.01); *H05K 1/111* (2013.01); *H01L 21/568* (2013.01); *H01L 23/3128* (2013.01); *H01L 23/49541* (2013.01); *H01L 24/16* (2013.01); *H01L 24/29* (2013.01); *H01L 24/32* (2013.01); *H01L 24/48* (2013.01); *H01L 2221/68345* (2013.01); *H01L 2221/68359* (2013.01); *H01L 2224/16245* (2013.01); *H01L 2224/2919* (2013.01); *H01L 2224/32245* (2013.01); *H01L 2224/48091* (2013.01); *H01L 2224/48105* (2013.01); *H01L 2224/48245* (2013.01); *H01L 2224/81005* (2013.01); *H01L 2224/8149* (2013.01); *H01L 2224/81439* (2013.01); *H01L 2224/81444* (2013.01); *H01L 2224/81447* (2013.01); *H01L 2224/83005* (2013.01); *H01L 2224/8349* (2013.01); *H01L 2224/83439* (2013.01); *H01L 2224/83444* (2013.01); *H01L 2224/83447* (2013.01); *H01L 2224/85* (2013.01); *H01L 2224/85005* (2013.01); *H01L 2224/8549* (2013.01); *H01L 2224/85439* (2013.01); *H01L 2224/85444* (2013.01); *H01L 2224/85447* (2013.01); *H01L 2924/00014* (2013.01); *H01L 2924/15311* (2013.01); *H01L 2924/181* (2013.01)

(56) References Cited

U.S. PATENT DOCUMENTS

| | | | |
|---|---|---|---|
| 2007/0268675 A1 | 11/2007 | Chinda et al. | |
| 2010/0314037 A1* | 12/2010 | Liu | 156/248 |
| 2015/0090476 A1* | 4/2015 | Sun | 174/250 |

FOREIGN PATENT DOCUMENTS

| | | |
|---|---|---|
| JP | 2007311688 | 11/2007 |
| JP | 2008004862 | 1/2008 |
| JP | 2008283226 | 11/2008 |
| JP | 2009038134 | 2/2009 |
| JP | 2009252827 | 10/2009 |
| JP | 2011198977 | 10/2011 |
| JP | 2013021294 | 1/2013 |
| JP | 2013138115 | 7/2013 |
| TW | 200539776 | 12/2005 |
| TW | 201117681 | 5/2011 |
| TW | 201218323 | 5/2012 |
| WO | 2008001915 | 1/2008 |

OTHER PUBLICATIONS

"Office Action of Japan Counterpart Application", issued on Jul. 21, 2015, p. 1-p. 4.

* cited by examiner

PACKAGE CARRIER AND MANUFACTURING METHOD THEREOF

CROSS-REFERENCE TO RELATED APPLICATION

This application claims the priority benefit of Taiwan application serial no. 102135030, filed on Sep. 27, 2013. The entirety of the above-mentioned patent application is hereby incorporated by reference herein and made a part of this specification.

BACKGROUND OF THE INVENTION

The present invention relates to a package structure and a manufacturing method thereof. More particularly, the present invention relates to a package carrier and a manufacturing method thereof.

DESCRIPTION OF RELATED ART

The purpose of chip packages is to protect exposed chips, to reduce contact density in a chip, and to provide good thermal dissipation for chips. The chip can be connected to the carrier by wire bonding or by flip chip bonding, such that the bonding pads on the chip can be electrically connected to contacts of the carrier, thereby forming a chip package. Therefore, the contacts on the chip can be re-distributed through the package carrier, so as to comply with contact distribution of external devices of next hierarchy.

Generally, in order to form the package carrier, a core dielectric layer often serves as a core material, and patterned circuit layers and patterned dielectric layers are alternately stacked on the core dielectric layer by performing a fully additive process, a semi-additive process, a subtractive process, or any other process. Consequently, the core accounts for a relative great proportion of the whole thickness of the package carrier. Therefore, if there is a bottleneck in reducing the thickness of the core dielectric layer, it will be hard for the whole thickness of the package structure to be remarkably reduced.

SUMMARY OF THE INVENTION

The present invention is directed to a package carrier capable of carrying a chip and the thickness of a package structure using the package carrier is reduced.

The present invention is directed to a manufacturing method of a package carrier for manufacturing the package carrier described above.

The present invention provides a manufacturing method of a package carrier including the following steps. Firstly, two base metal layers are bonded. Next, two supporting layers are laminated onto the base metal layers respectively. Next, two release metal films are disposed on the supporting layers respectively, wherein each of the release metal films includes a first metal foil and a second metal foil separable from each other. Next, two patterned metal layer are formed on the release metal films respectively, wherein each of the patterned metal layers is capable of carrying and electrically connected to a chip. Afterward, the two base metal layers are separated from each other to form two package carriers independent from each other.

The present invention provides a package carrier capable of carrying a chip. The package carrier includes a supporting layer, a base metal layer, a release metal film and a patterned metal layer. The supporting layer includes a first surface and a second surface opposite to the first surface. The base metal layer is disposed on the first surface of the supporting layer. The release metal film is disposed on the second surface of the supporting layer. The release metal film includes a first metal foil and a second metal foil, and the second metal foil is bonded with the supporting layer. The patterned metal layer is disposed on the first metal foil, wherein the chip is adapted to be disposed on the patterned metal layer and electrically connected to the patterned metal layer.

In light of the foregoing descriptions, the manufacturing processes of the package carrier in the invention are symmetrically performed on two base metal layers bonded with each other. Therefore, two independent package carriers are formed simultaneously after the base metal layers are separated, so as to save the manufacturing time and improve the production efficiency. In addition, the package carrier of the invention adopts the patterned metal layer to carry and electrically connects the chip, and the release metal film is connected between the supporting layer and the patterned metal layer, such that the supporting layer can be easily removed after the molding process by adopting the separable characteristic of the release metal film. Therefore, comparing with the conventional package carrier composed of a plurality of patterned circuit layers and patterned dielectric layers alternately stacked on the core dielectric layer, the package carrier of the invention allows the package structure using said package carrier to have a thinner overall thickness.

To make the above features and advantages of the present invention more comprehensible, several embodiments accompanied with drawings are described in detail as follows.

DESCRIPTION OF EMBODIMENTS

FIGS. 1A to 1G are schematic cross-sectional views illustrating manufacturing steps of a package carrier according to an embodiment of the present invention. In the present embodiment, a manufacturing method of a package carrier includes the following steps. Firstly, referring to FIG. 1A, two base metal layers 110 are bonded. In the present embodiment, the two base metal layers 110 may be two copper foils, and is bonded by dispensing an adhesive layer 105 on edges of the two base metal layers 110 to form a sealing region at the edges of the two base metal layers 110, such that the two base metal layers can be bonded together temporarily for preventing infiltration of chemicals or reagents used in subsequent processes.

Figure 1A:
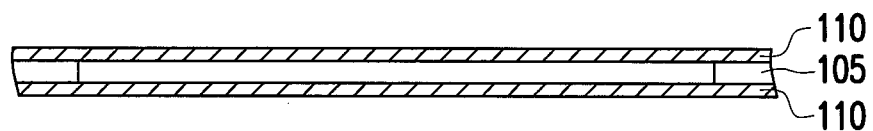
FIGS. 1A to 1G are schematic cross-sectional views illustrating manufacturing steps of a package carrier according to an embodiment of the present invention.
Figure 1B:
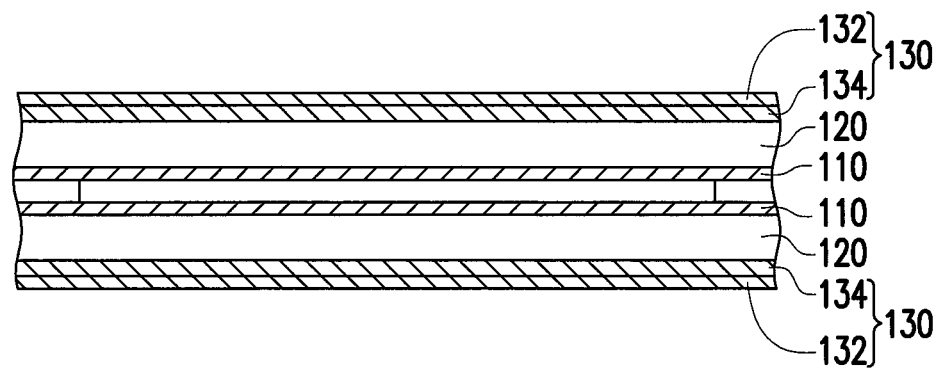

Referring to FIG. 1B, two supporting layers 120 are laminated onto the base metal layers 110 respectively. Then, two release metal films 130 are disposed on the supporting layers 120 respectively, wherein each of the release metal films 130 includes a first metal foil 132 and a second metal foil 134 separable from each other. In one embodiment of the invention, the thickness of the second metal foil 134 is substantially greater than the thickness of the first metal foil 132. To be specific, the thickness of the second metal foil 134 is about 18 micrometers (μm), and the thickness of the first metal foil 132 is about 5 micrometers. It is for sure that the present invention should not be construed as limited to the embodiments of the present invention.

Figure 1C:
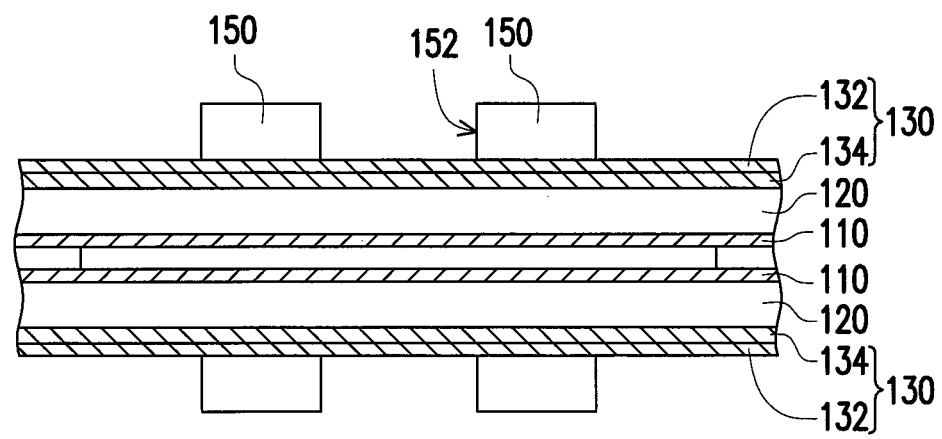
Figure 1D:
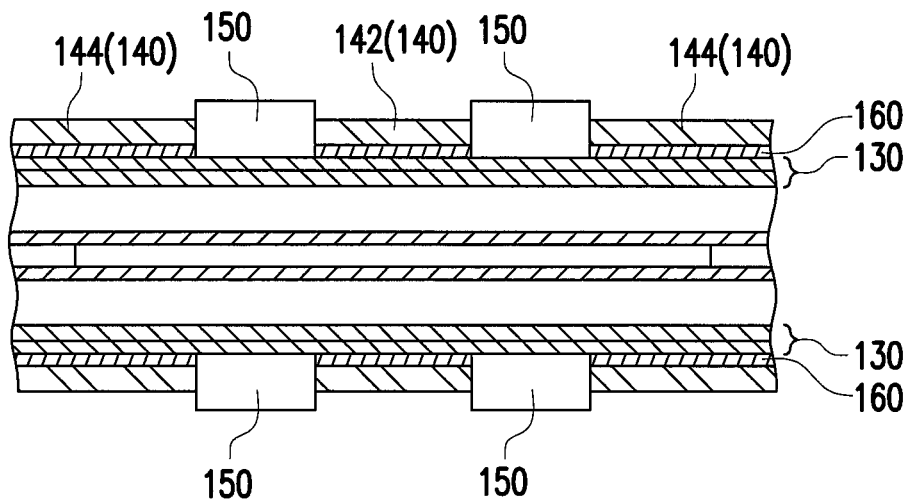

Next, referring to both FIG. 1C and FIG. 1D, two patterned photo-resist layers 150 shown in FIG. 1C are formed on the two release metal films 130 respectively, wherein each of the patterned photo-resist layers 150 may includes a plurality of openings 152 to expose a part of the corresponding release metal film 130. Next, referring to FIG. 1D, the two patterned metal layers 140 are respectively formed in the openings 152 by using the patterned photo-resist layers 150 as masks, such that the two patterned metal layers 140 cover the part of the release metal films 130 exposed by the openings 152. Each of the patterned metal layers 140 is capable of carrying and electrically connecting a chip. In the present embodiment, each of the patterned metal layers 140 may include a chip pad 142 and a plurality of bonding pads 144 shown in FIG. 1D. The chip may be, for example, disposed on the chip pad 142 and electrically connected to the bonding pads 144 by a plurality of conductive wires. In the present embodiment, the patterned metal layer 140 includes a plurality of circuits, and the width of each circuit of the patterned metal layer 140 is, for example, between 15 micrometers to 35 micrometers. That is, the circuits of the patterned metal layer 140 of the present embodiment may be seen as fine circuits. Moreover, the thickness of the patterned metal layer 140 formed by the method described above can be controlled according to the thickness of the patterned photo-resist layer 150. Therefore, a user may adjust the thickness of the package carrier formed by said manufacturing method by controlling the thickness of the patterned metal layer 140. Of course, in other embodiment, the patterned metal layers 140 may also be formed by subtractive process such as etching process.

In addition, in an embodiment of the invention, two etching stop layers 160 may be respectively formed on the parts of the release metal films exposed by the openings 152 before the patterned metal layers 140 are formed. The etching stop layers 160 are, for example, nickel layers, and may be formed in the openings 152 of the patterned photo-resist layers 150 by electroplating.

Figure 1E:
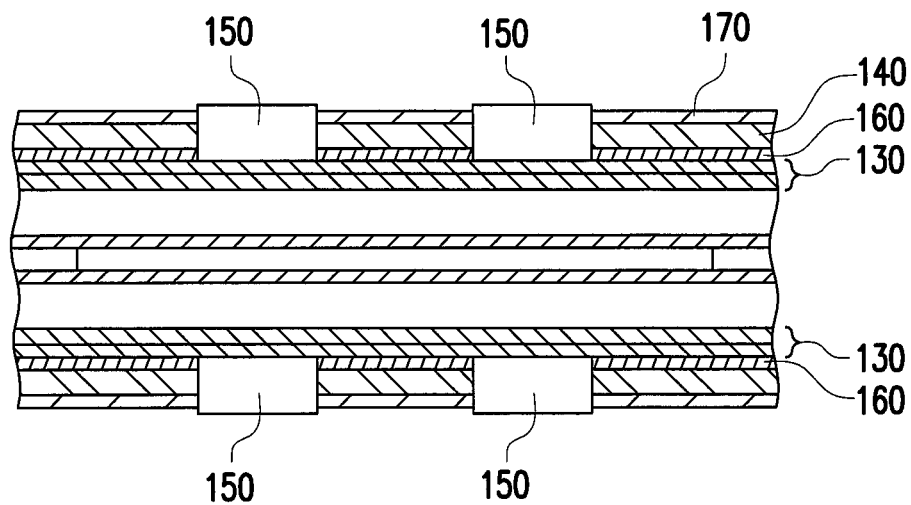
Figure 1F:
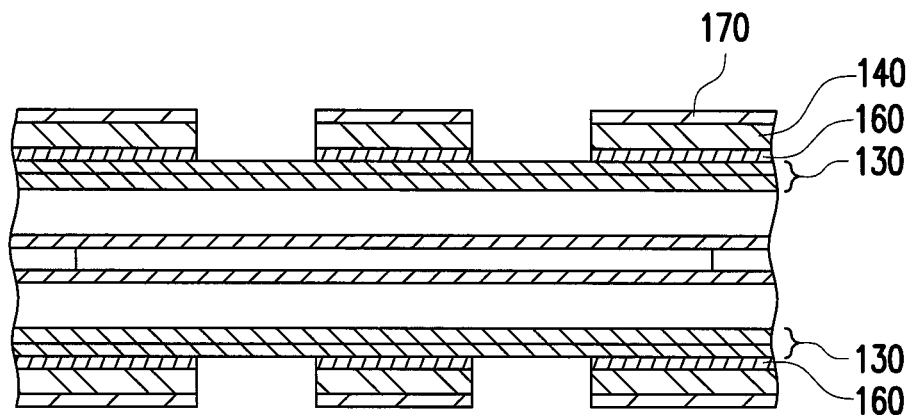

Afterward, two surface treatment layers 170 are formed on top surfaces of the two patterned metal layers 140 respectively as shown in FIG. 1E. In the present embodiment, each of the surface treatment layer 170 includes an electroplated gold layer, an electroplated silver layer, a reduced gold layer, a reduced silver layer, an electroplated nickel-palladium-gold layer, a chemical plated nickel-palladium-gold layer or an organic solderability preservatives (OSP) layer, etc. Of course, the embodiment is not limited thereto. After that, the patterned photo-resist layers 150 are removed, so as to form the two patterned metal layers 140 shown in FIG. 1F on the two release metal films 130 respectively.

Figure 1G:
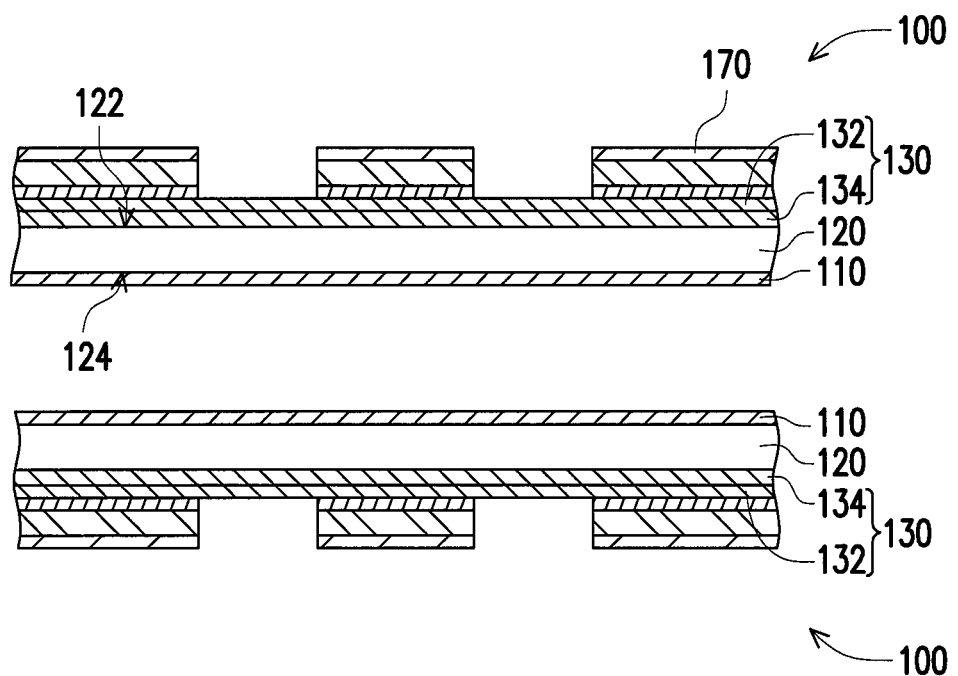

Afterward, the sealing region of the two base metal layers 110 are separated, such that the two base metal layers 110 are separated from each other to form two package carriers 100 independent from each other as shown in FIG. 1G. Accordingly, each of the package carriers 100 formed by the manufacturing method described above includes a base metal layer 110, a supporting layer 120, a release metal film 130 and a patterned metal layer 140. The supporting layer 120 includes a first surface 122 and a second surface 124 opposite to the first surface 122. The base metal layer 110 is disposed on the first surface 122 of the supporting layer 120. The release metal film 130 is disposed on the second surface 124 of the supporting layer 120, wherein the release metal film 130 includes a first metal foil 132 and a second metal foil 134 separable from each other. The second metal foil 134 is bonded with the supporting layer 120 and the patterned metal layer 140 is disposed on the first metal foil 132. That is to say, the first metal foil 132 and the second metal foil 134 are respectively bonded with the patterned metal layer 140 and the supporting layer 120.

It is noted that, in the present embodiment, the supporting layers 120 and the patterned metal layers 140 thereon are symmetrically formed, so the warp of the structure during the lamination process of the supporting layers 120 can be effectively avoided. Furthermore, the manufacturing processes of the package carrier of the embodiment are symmetrically performed on the two base metal layers bonded with each other, so two independent package carriers are formed simultaneously after the base metal layers are separated, such that the manufacturing time is saved and the production efficiency is improved.

Figure 2A:
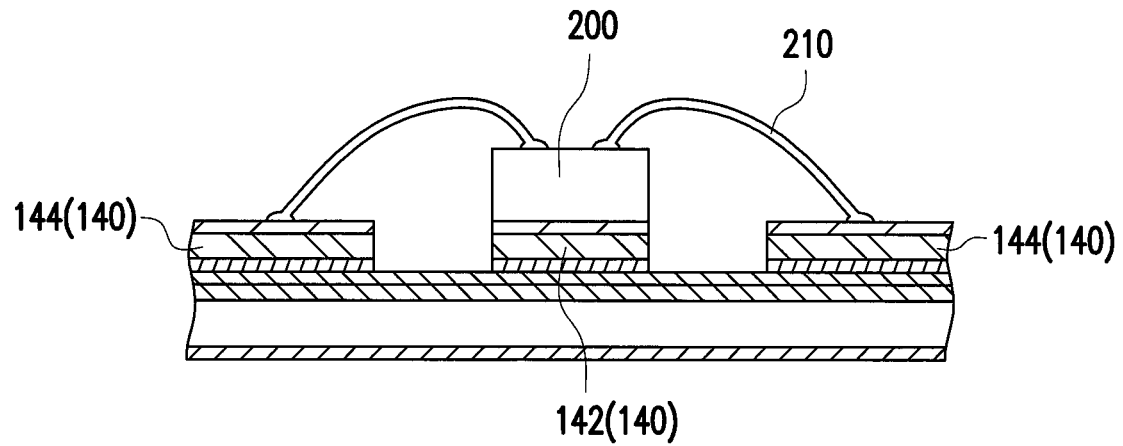
FIGS. 2A to 2D are schematic cross-sectional views illustrating manufacturing steps of the package carrier depicted in FIG. 1G carrying a chip.

FIGS. 2A to 2D are schematic cross-sectional views illustrating manufacturing steps of the package carrier depicted in FIG. 1G carrying a chip. Referring to FIG. 2A, in the present embodiment, the package carrier 100 formed by the manufacturing method described above is capable of carrying and electrically connect a chip 200. In the present embodiment, the chip 200 may be, for example, a single chip or a chip module. Hence, this embodiment does not restrict the types of the chip 200. The chip 200 may be disposed on the chip pad 142 of the patterned metal layer 140 through an adhesive layer, and the chip 200 may be electrically connected to the bonding pads 144 of the patterned metal layer 140 by a plurality of conductive wires 210. That is to say, the chip 200 of the present embodiment is electrically connected to the patterned metal layer 140 through wire bonding.

Figure 2B:
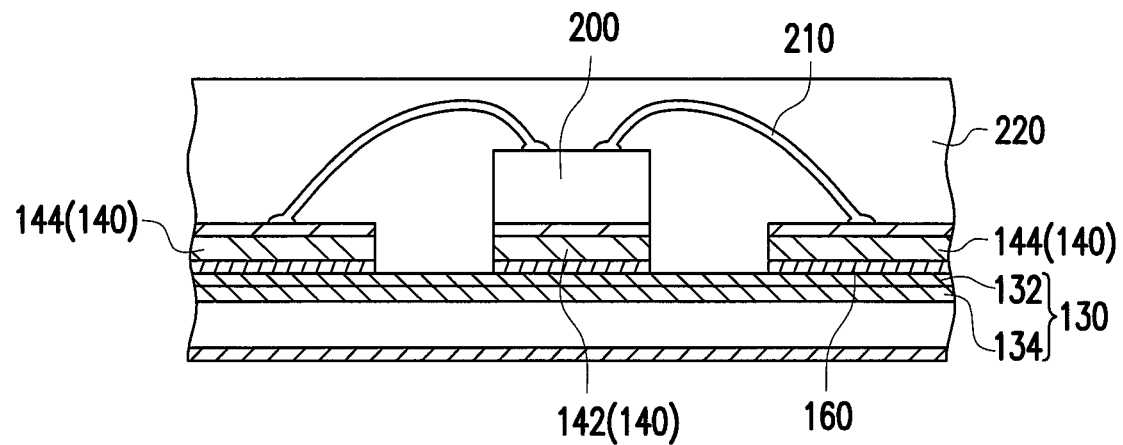
Figure 2C:
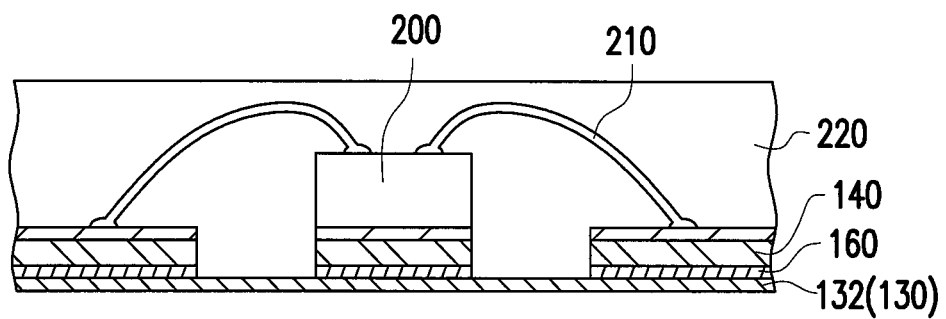

Next, referring to FIG. 2B, a molding process is performed to form a molding compound 220 on the package carrier 100, wherein the molding compound 200 covers the chip 200, the conductive wires 210 and the patterned metal layer 140 and covers a part of the first surface 122 of the supporting layer 120. Afterward, referring to FIG. 2C, the first metal foil 132 and the second metal foil 134 are separated from, each other to remove the supporting layer 120, and then the release metal film 130 such as the first metal foil 132 remaining on the patterned metal layer 140 is removed by etching process to expose the patterned metal layer 140 and a bottom surface of the molding compound 220.

Figure 2D:
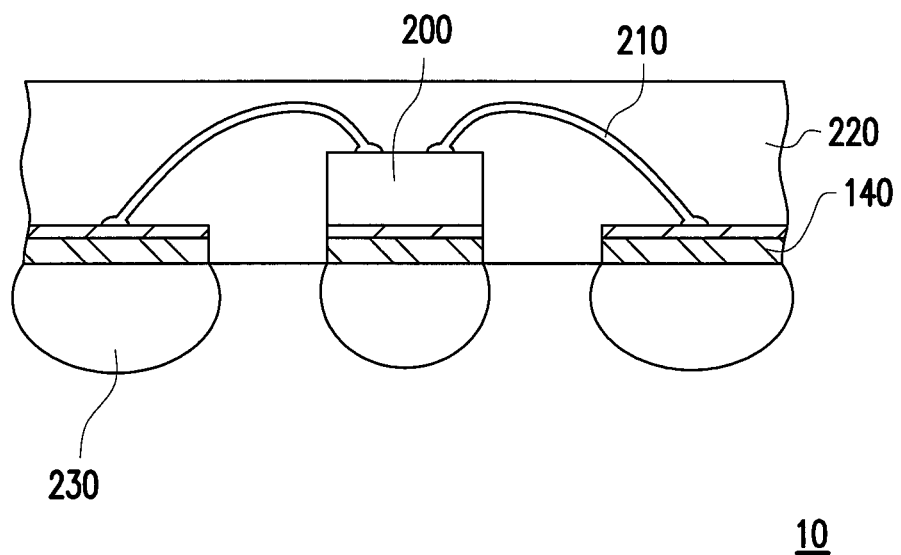

Herein, the etching stop layer 160 is firstly formed on the release metal film 130 before the patterned metal layer 140 is formed. That is, the etching stop layer 160 is located between the patterned metal layer 140 and the release metal film 130. Therefore, when the release metal film 130 is removed by the etching process, the etching process would stop at the etching stop layer 160 so that the patterned metal layer 140 would not be subjected to damage. Finally, the etching stop layer 160 is removed to form the package structure 10 as shown in FIG. 2D. In the present embodiment, the package structure 10 is electrically connected to an external electronic device by, for example, a plurality of solder balls 230.

It is noted that the invention does not limit the bonding method of the chip 200 and the package carrier 100, even though the chip 200 is shown to be electrically connected to the package carrier 100 through wire bonding. However, in other embodiment, the chip 200 may also be electrically connected to the patterned metal layer 140 through flip chip bonding technique. That is, the aforesaid bonding methods of the chip 200 and the package carrier 100 are merely exemplary and should not be construed as limitations to the present invention.

In sum, the manufacturing processes of the package carrier of the invention are symmetrically performed on two base metal layers bonded with each other. Therefore, two independent package carriers are formed simultaneously after the base metal layers are separated, such that the manufacturing time can be saved and the production efficiency can be improved. In addition, the invention uses the patterned metal layer to carry and electrically connects the chip, and the release metal film is connected between the supporting layer and the patterned metal layer, such that the supporting layer can be easily removed after the molding process by taking advantage of the separable characteristic of the release metal film. Therefore, comparing with the conventional package carrier composed of a plurality of patterned circuit layers and patterned dielectric layers alternately stacked on the core dielectric layer, the package carrier of the invention allows the package structure using said package carrier to have a thinner overall thickness. Moreover, the heat generated by the chip can be quickly dissipated to external environment directly through the patterned metal layer since the chip is disposed on the patterned metal layer. That is, the package carrier of the invention not only can effectively reduce the overall thickness of the package structure, but also can improve the heat dissipation efficiency of the package structure.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A manufacturing method of a package carrier, comprising:
   bonding two base metal layers;
   laminating two supporting layers onto the base metal layers respectively;
   disposing two release metal films on the supporting layers respectively, wherein each of the release metal films comprises a first metal foil and a second metal foil separable from each other;
   forming two patterned metal layers on the release metal films respectively, wherein each of the patterned metal layers is capable of carrying and electrically connected to a chip; and
   separating the two base metal layers from each other to form two package carriers independent from each other.

2. The manufacturing method as claimed in claim 1, wherein the thickness of the second metal foil is substantially greater than the thickness of the first metal foil.

3. The manufacturing method as claimed in claim 1, wherein the step of forming the patterned metal layers on the release metal films respectively comprises:
   forming two patterned photo-resist layers on the release metal films respectively, the patterned photo-resist layers respectively exposing a part of the release metal films; and
   forming two patterned metal layers on the exposed part of the release metal films respectively by using the patterned photo-resist layers as masks; and
   removing the patterned photo-resist layers.

4. The manufacturing method as claimed in claim 3, further comprising:
   forming two etching stop layers on the exposed part of the release metal films respectively before forming the patterned metal layers on the exposed part of the release metal films respectively.

5. The manufacturing method as claimed in claim 4, wherein each of the etching stop layers comprises electroplated nickel layer.

6. The manufacturing method as claimed in claim 3, further comprising:
   forming two surface treatment layers on the patterned metal layers respectively after forming the patterned metal layers on the exposed part of the release metal films respectively.

7. The manufacturing method as claimed in claim 6, wherein each of the surface treatment layers comprises an electroplated gold layer, an electroplated silver layer, a reduced gold layer, a reduced silver layer, an electroplated nickel-palladium-gold layer, a chemical plated nickel-palladium-gold layer or an organic solderability preservatives (OSP) layer.

8. The manufacturing method as claimed in claim 1, wherein the step of bonding the base metal layers comprises:
   adhering edges of the base metal layers together by an adhesive layer to form a sealing region at the edges of the base metal layers.

9. The manufacturing method as claimed in claim 8, wherein the step of bonding the base metal layers comprises:
   separating the sealing region of the base metal layers.

\* \* \* \* \*